(12) United States Patent
Mueller et al.

(10) Patent No.: US 10,379,444 B2
(45) Date of Patent: Aug. 13, 2019

(54) ILLUMINATION OPTIC FOR EUV PROJECTION LITHOGRAPHY

(71) Applicant: Carl Zeiss SMT GmbH, Oberkochen (DE)

(72) Inventors: Matthias Mueller, Lauchheim (DE); Thomas Fischer, Aalen (DE); Stefan Seitz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/815,238

(22) Filed: Nov. 16, 2017

(65) Prior Publication Data

US 2018/0074410 A1    Mar. 15, 2018

Related U.S. Application Data

(63) Continuation of application No. PCT/EP2016/060284, filed on May 9, 2016.

(30) Foreign Application Priority Data

May 20, 2015    (DE) .................. 10 2015 209 176

(51) Int. Cl.
*G03F 7/20*  (2006.01)
*G02B 5/08*  (2006.01)
(Continued)

(52) U.S. Cl.
CPC ........ *G03F 7/70116* (2013.01); *G02B 5/0891* (2013.01); *G02B 5/09* (2013.01);
(Continued)

(58) Field of Classification Search
CPC ............ G03F 7/70075; G03F 7/70116; G03F 7/70941; G03F 7/70058; G03F 7/70033;
(Continued)

(56) References Cited

U.S. PATENT DOCUMENTS 6,859,515 B2    2/2005   Schutlz et al.
7,329,014 B2 *  2/2008   Balogh ................. B82Y 10/00
                                            359/845
(Continued)

FOREIGN PATENT DOCUMENTS

DE    10 2011 005 778 A1    9/2012
EP       1 225 481 A         7/2002
(Continued)

OTHER PUBLICATIONS

German Office Action, with translation thereof, for corresponding DE Appl No. 10 2015 209 176.7, dated Jan. 13, 2016.
(Continued)

*Primary Examiner* — Deoram Persaud
(74) *Attorney, Agent, or Firm* — Fish & Richardson P.C.

(57) ABSTRACT

An illumination optical unit for EUV projection lithography illuminates an object field with illumination light. The illumination optical unit has a first facet mirror including a plurality of first facets on a first mirror carrier. Disposed downstream of the first facet mirror is a second facet mirror including a plurality of second facets arranged on a second mirror carrier around a facet arrangement center. Partial beams of the illumination light are guided superposed on one another into the object field, respectively via illumination channels which have one of the first facets and one of the second facets. Second maximum angle facets are arranged at the edge of the second mirror carrier. The second maximum angle facets predetermine maximum illumination angles of the illumination light which deviate maximally from a chief ray incidence on the object field.

23 Claims, 7 Drawing Sheets

(51) Int. Cl.
*G02B 5/09* (2006.01)
*G02B 19/00* (2006.01)
*G02B 26/08* (2006.01)

(52) U.S. Cl.
CPC ..... *G02B 19/0023* (2013.01); *G02B 19/0095* (2013.01); *G02B 26/0816* (2013.01); *G03F 7/70075* (2013.01); *G03F 7/70941* (2013.01); *G03F 7/70058* (2013.01); *G21K 2201/065* (2013.01)

(58) Field of Classification Search
CPC ............ G02B 19/0023; G02B 19/0095; G02B 26/0816; G02B 5/0891; G02B 5/09; G21K 2201/065
See application file for complete search history.

(56) References Cited

U.S. PATENT DOCUMENTS

| | | | | |
|---|---|---|---|---|
| 8,717,531 | B2* | 5/2014 | Waldis | G02B 5/0808 355/30 |
| 8,964,162 | B2* | 2/2015 | Fiolka | G02B 17/0892 355/30 |
| 9,915,872 | B2* | 3/2018 | Eisenmenger | G02B 17/0892 |
| 2003/0016539 | A1* | 1/2003 | Minano | F21V 7/04 362/347 |
| 2003/0043455 | A1 | 3/2003 | Singer et al. | |
| 2003/0169520 | A1 | 9/2003 | Goldstein | |
| 2005/0219497 | A1* | 10/2005 | Bleeker | G03F 7/70291 355/69 |
| 2008/0239268 | A1* | 10/2008 | Mulder | G03F 7/70116 355/67 |
| 2009/0090877 | A1* | 4/2009 | Van Empel | G03F 7/70175 250/504 R |
| 2009/0267003 | A1 | 10/2009 | Moriya et al. | |
| 2010/0007866 | A1* | 1/2010 | Warm | B29D 11/00596 355/66 |
| 2010/0200777 | A1* | 8/2010 | Hauf | G02B 7/1815 250/504 R |
| 2011/0181852 | A1* | 7/2011 | Bleidistel | G02B 7/1827 355/30 |
| 2012/0013882 | A1* | 1/2012 | Loopstra | G03F 7/70075 355/67 |
| 2012/0147345 | A1* | 6/2012 | Buis | G02B 7/1821 355/66 |
| 2012/0154777 | A1 | 6/2012 | De Vries et al. | |
| 2012/0262689 | A1* | 10/2012 | Van Ingen Schenau | G03F 7/70116 355/67 |
| 2012/0262690 | A1* | 10/2012 | De Boeij | G03F 7/70116 355/67 |
| 2014/0071523 | A1 | 3/2014 | Hartjes et al. | |
| 2014/0211187 | A1* | 7/2014 | Hauf | G02B 7/1815 355/67 |

FOREIGN PATENT DOCUMENTS

WO WO 2011/154244 A1 12/2011
WO WO 2014/075902 A1 5/2014

OTHER PUBLICATIONS

Translation of International Search Report for corresponding Appl No. PCT/EP2016/060284, dated Aug. 23, 2016.

* cited by examiner

ILLUMINATION OPTIC FOR EUV PROJECTION LITHOGRAPHY

CROSS-REFERENCE TO RELATED APPLICATIONS

The present application is a continuation of, and claims benefit under 35 USC 120 to, international application PCT/EP2016/060284, filed May 9, 2016, which claims benefit under 35 USC 119 of German Application No. 10 2015 209 176.7, filed May 20, 2015. The entire disclosure of these applications are incorporated by reference herein.

FIELD

The disclosure relates to an illumination optical unit for EUV projection lithography. Further, the disclosure relates to a second facet mirror for use in such an illumination optical unit, an optical system including such an illumination optical unit, a projection exposure apparatus including such an optical system, a method for producing a microstructured or nanostructured component using such a projection exposure apparatus and a component structured using such a production method.

BACKGROUND

A projection exposure apparatus including an illumination optical unit is known from WO 2011/154244 A1 and WO 2014/075902 A1. Use is made of tiltable first facets for flexibly predetermining illumination settings, i.e. illumination angle distributions for illuminating structures that are imaged during the projection lithography. A change between various illumination settings is used. Illumination optical units and components for EUV projection lithography are known from US 2012/0262690 A1, DE 10 2011 005 778 A1 and US 2003/0169520 A1.

SUMMARY

The disclosure seeks to develop an illumination optical unit that suppresses extraneous light suppression without unwanted thermal or optical effects.

In an aspect, the disclosure provides an illumination optical unit for EUV projection lithography for illuminating an object field with illumination light. The unit includes a first facet mirror that is in a beam path of the illumination light and includes a plurality of first facets arranged on a first mirror carrier. At least some of the first facets are adjustable between a plurality of tilt positions. The unit also includes a second facet mirror that is disposed downstream of the first facet mirror in the beam path of the illumination light and includes a plurality of second facets arranged on a second mirror carrier around a facet arrangement center. Partial beams of the illumination light are guided superposed on one another into the object field, respectively via illumination channels, wherein one of the first facets and one of the second facets belongs to each of the illumination channels. Second maximum angle facets are arranged at the edge of the second mirror carrier. The second maximum angle facets predetermine maximum illumination angles of the illumination light which deviate maximally from a chief ray incidence on the object field. The second mirror carrier has an illumination light trap portion, the distance of which from the facet arrangement center is greater than a distance of the second maximum angle facets from the facet arrangement center. The illumination light trap portion has at least one reflection surface that is inclined in relation to a carrier plane of the second mirror carrier. The reflection surface of the illumination light trap portion is arranged conically around the facet arrangement center.

In an aspect, the disclosure provides an illumination optical unit for EUV projection lithography for illuminating an object field with illumination light. The unit includes a first facet mirror that is in a beam path of the illumination light and includes a plurality of first facets arranged on a first mirror carrier. At least some of the first facets are adjustable between a plurality of tilt positions. The unit includes a second facet mirror that is disposed downstream of the first facet mirror in the beam path of the illumination light and includes a plurality of second facets arranged on a second mirror carrier around a facet arrangement center. Partial beams of the illumination light are guided superposed on one another into the object field, respectively via illumination channels. One of the first facets and one of the second facets belongs to each of the illumination channels. Second maximum angle facets arranged at the edge of the second mirror carrier predetermine maximum illumination angles of the illumination light which deviate maximally from a chief ray incidence on the object field. The second mirror carrier has an illumination light trap portion, the distance of which from the facet arrangement center is at most as large as a distance of the maximum angle facets from the facet arrangement center. The illumination light trap portion is coupled thermally to a trap heat sink for dissipating thermal energy.

The features of both of the preceding aspects can be combined as desired.

At least one illumination light trap portion can be arranged at a greater distance from the facet arrangement center when compared to the distance of the maximum angle facets facilitates a controlled dissipation to a location outside of an arrangement of the second facets of light components not required for the illumination, where thermal or optical effects of such light dissipation do not have an interfering effect. A controlled dissipation of corresponding illumination light components can be used for optimizing an imaging quality, can be used for correcting system errors and/or can be used for illuminating further illumination optical units or can be used for assisting different light sources. For the purposes of the controlled dissipation of these illumination light components, the first facets, i.e. the facets of the first facet mirror, can be repositioned into a corresponding dissipation tilt position. The first facet mirror can be a field facet mirror which may be arranged in the region of a field plane of the illumination optical unit. The arrangement of such a field facet mirror in the field plane need not be exact. The second facet mirror can be a pupil facet mirror which is arranged in the region of a pupil plane of the illumination optical unit. The arrangement of the pupil facet mirror in the pupil plane need not be exact. The chief ray incidence on the object field is the angle of incidence of a chief ray of the illumination light, in particular of the chief ray of a central object field point, on the object field. The illumination light trap portion can be arranged, in part or completely, around the facet arrangement center.

The illumination light trap portion has at least one reflection surface that is inclined in relation to a carrier plane of the second mirror carrier. Such an embodiment of the illumination light trap portion facilitates a controlled dissipation of illumination light by reflection away from a beam path that is used for illumination purposes. The reflection surface of the illumination light trap portion is arranged conically around the facet arrangement center. Such a conical arrangement can be manufactured with comparatively little outlay. Such a conical arrangement can also be embodied as an absorbing surface as an alternative or in addition to a reflection surface.

Unwanted thermal or optical effects of the extraneous light are avoided by the illumination optical unit according to the disclosure. In particular, bothersome stray light is avoided.

The illumination light trap portion according to the disclosure can be in thermal contact with, or thermally coupled to, an active and/or passive cooling device or a heat sink for dissipating thermal energy.

The illumination light trap portion can have, at least in parts, an absorbing embodiment for the illumination light. Such a absorbing embodiment can be obtained by a coating and/or by a material selection for the illumination light trap portion. A purely absorbing coating can be used as a coating, for example a strongly absorbing coating which, depending on the wavelengths to be absorbed, may consist of Ag, Pt, Co, Ni, Sn, Cu, Te, of alloys of these materials or of oxides of these materials. Such a coating can be produced chemically or by electroplating. Such a coating can also be produced by blackening. For a chemically produced coating, use can be made of a chemically nickel-plated blackened coating, a coating that is pickled (e.g. to be black or blue) or a chromium-plated coating. By way of example, use can be made of non-rust chromium steels or chromium nickel steels, which are pickled; this is also referred to as Niro pickling. A coating that has been chrome-plated, nickel-plated, anodized or plasma chemically oxidized (PCO) to be black can be used as a coating that is being produced by electroplating. An absorbing embodiment of the illumination light trap portion can also be realized by the use of at least one absorbing material including an antireflection coating. The antireflection coating can have a specific embodiment depending on angle of incidence and wavelength. An absorbent embodiment can also be realized as a porous and/or columnar layer. Here, an absorbing effect can emerge by virtue of the light being intrinsically absorbed as a consequence of the respective material structure. This can be carried out independent of wavelength and illumination angle. Nickel, steel, aluminum, copper, magnesium or silver can be used as material. The illumination light trap portion can be embodied to be completely absorbing for the illumination light.

A surface of the illumination light trap portion can be structured, at least in parts, for producing a scattering effect for the illumination light. Such structuring can be used for dissipating unwanted light components by controlled scattering. A structure inclination angle of structures of a correspondingly structured illumination light trap portion can have a value of up to 60°. The structuring may be effectuated by fluting. The fluting can be embodied extending radially and/or tangentially in relation to the facet arrangement center. The surface of the illumination light trap portion can be completely structured for producing the scattering effect for the illumination light.

The illumination light trap portion can have, at least in part, a multiple reflection structure. Such a multiple reflection structure leads to an effective dissipation of unwanted light components. The multiple reflection structure can be embodied in the style of a labyrinth. The illumination light trap portion can be embodied complete as a multiple reflection structure.

The illumination light trap portion can have at least some local trap target regions. Such local trap target regions can be coupled, especially thermally, to cooling components of the second mirror carrier. Then, for the controlled dissipation of non-required illumination light components, the first facets can steer the non-required light components to the local trap target regions in a targeted manner when in their respective dissipation tilt position. The local trap target regions can be embodied by absorbing and/or multiply reflecting structures. The local trap target regions can be formed by absorption target locations or absorption spots and/or by undercuts with entry openings.

An inclination angle of the inclined reflection surface in relation to the carrier plane of the second mirror carrier can lie in the range between 5° and 60°. Such an inclination angle of the inclined reflection surface in relation to the carrier plane can lie in the range between 5° and 15°, in the range between 15° and 30°, in the range between 30° and 45°, in the range between 45° and 60° and, for example, in the region of 30°. Alternatively or additionally, a surface of the illumination light trap portion that is inclined in relation to a carrier plane of the second mirror carrier can be embodied to be absorbing, in part or completely, for the illumination light as well.

When designing an illumination optical unit with an illumination light trap portion, a region within the arrangement of the second facets can be specifically embodied for an increased thermal transport. Such illumination light trap portions can be special facets or specific regions within a facet arrangement of the second facet mirror. All of the first facets of the first facet mirror can be reversible between a plurality of tilt positions. The trap heat sink can be a heat sink which is arranged separately from any other mirror heat sink or, alternatively, from a portion of the mirror heat sink.

The advantages of a second facet mirror, of an optical system, of a projection exposure apparatus, of a production method, and of a micro- or nanostructured component can correspond to those which have already been explained above with reference to the illumination optical unit according to the disclosure and the assignment-prescription method according to the disclosure. The produced component can be a semiconductor chip, in particular a memory chip.

The projection exposure apparatus can have an object holder with an object displacement drive for displacing, along an object displacement direction, the object to be imaged. The projection exposure apparatus can have a wafer holder with a wafer displacement drive for displacing, along an image displacement direction, a wafer on which a structure of the object to be imaged is to be imaged. The object displacement direction may extend parallel to the image displacement direction.

Exemplary embodiments of the disclosure are explained in greater detail below with reference to the drawing. In the drawing.

Figure 1:
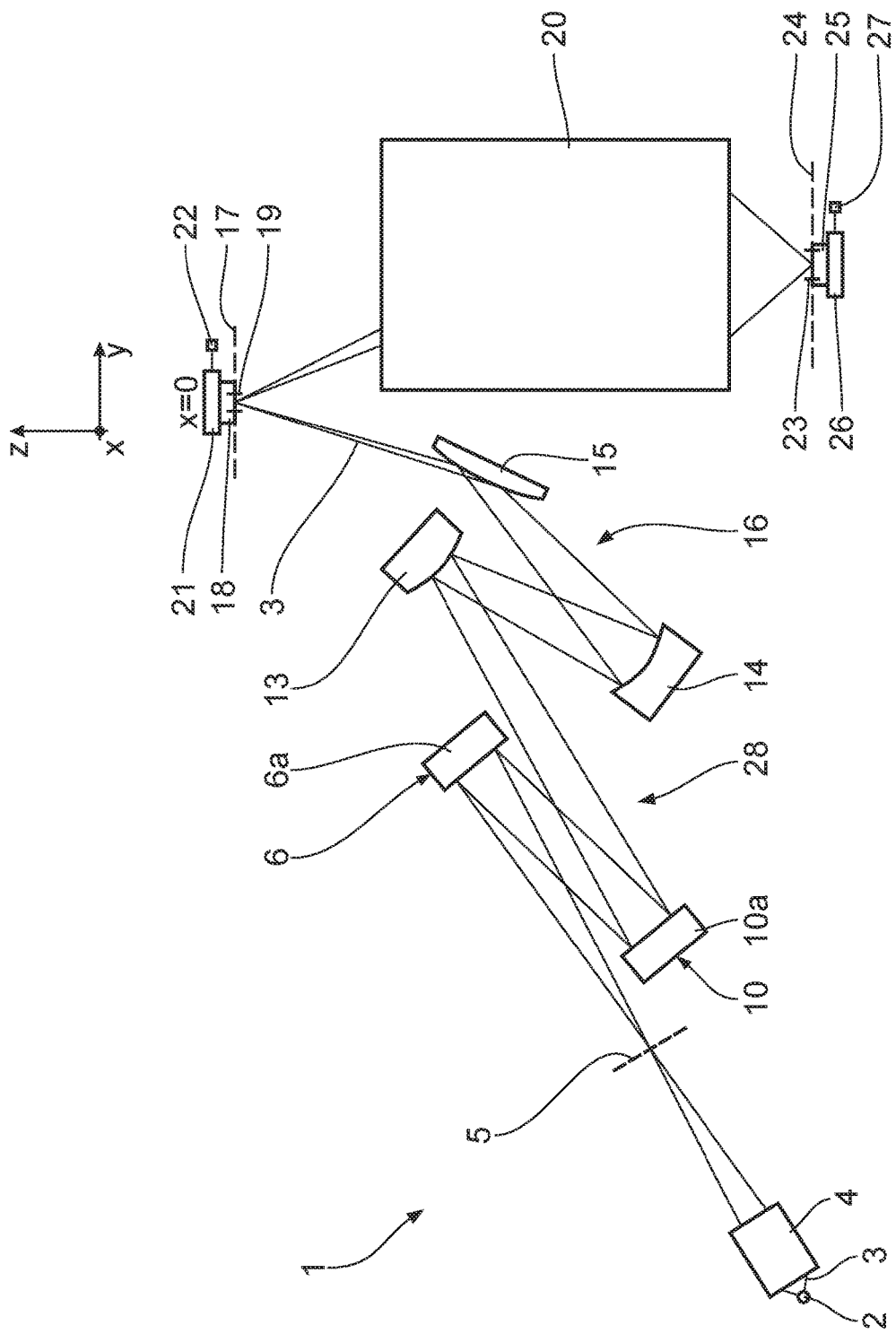
FIG. 1 shows a microlithographic projection exposure apparatus schematically and with regard to an illumination optical unit in a meridional section.
Figure 4:
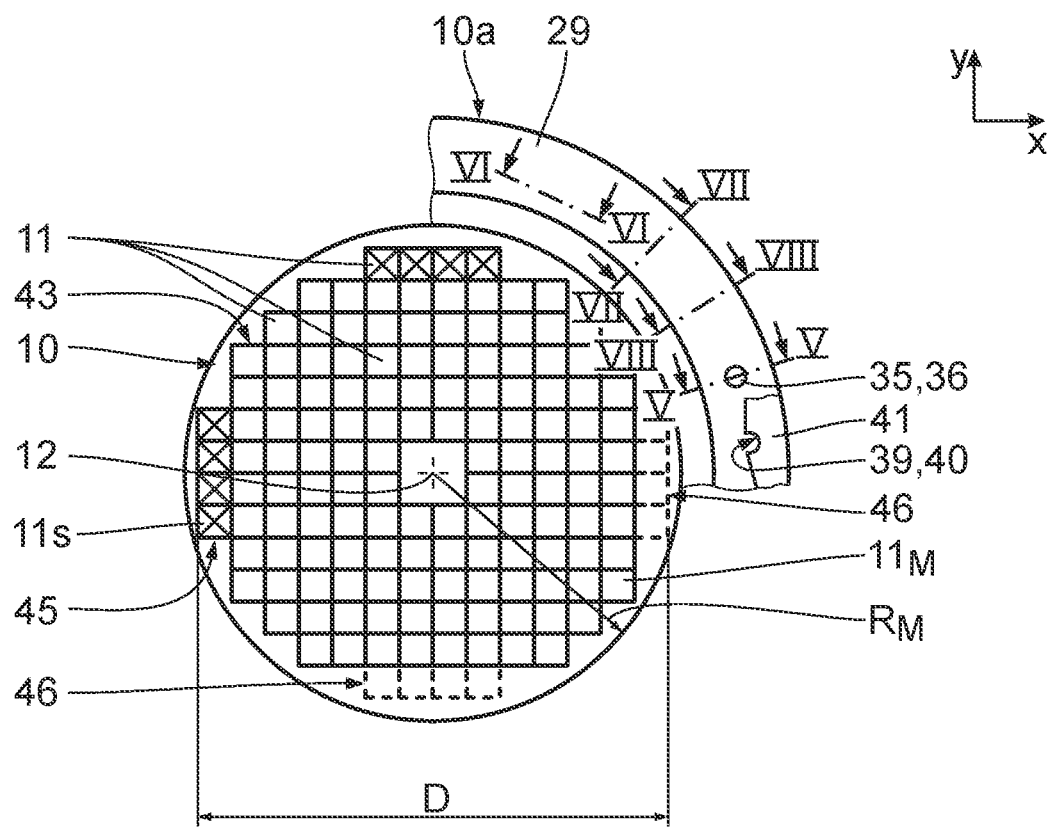
Figure 5:
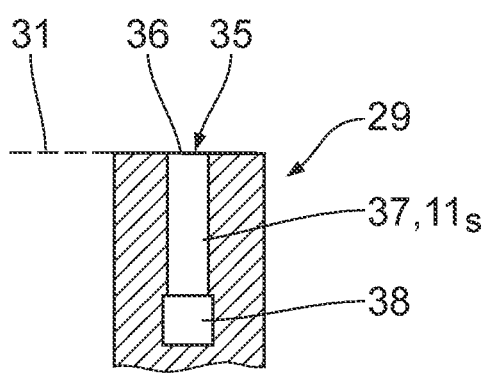
Figure 6:
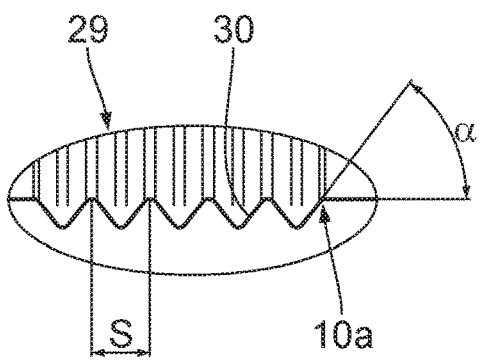
Figure 7:
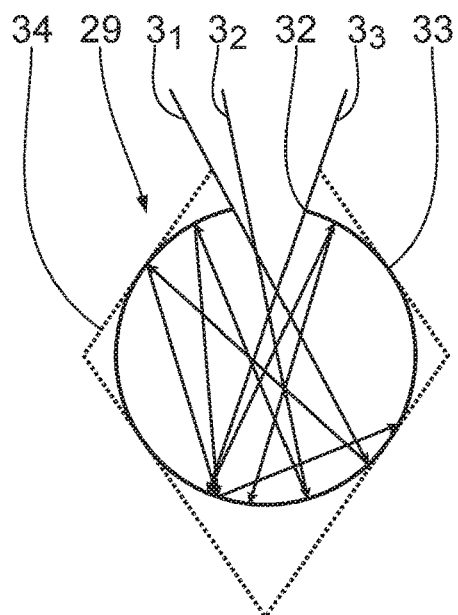
Figures 8A, 8B:
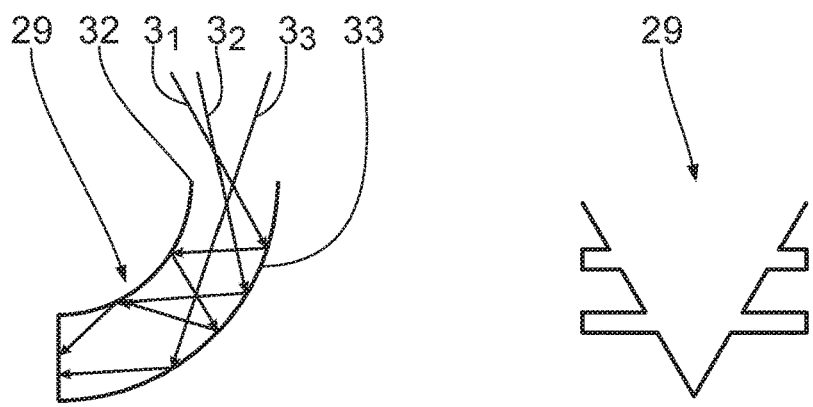
Figure 9:
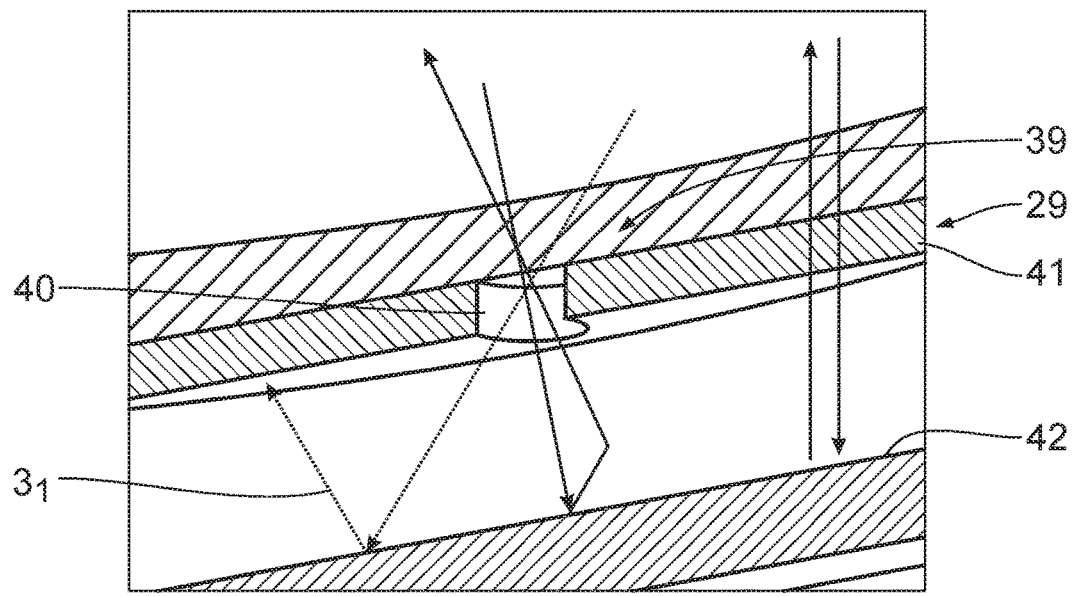
Figure 10:
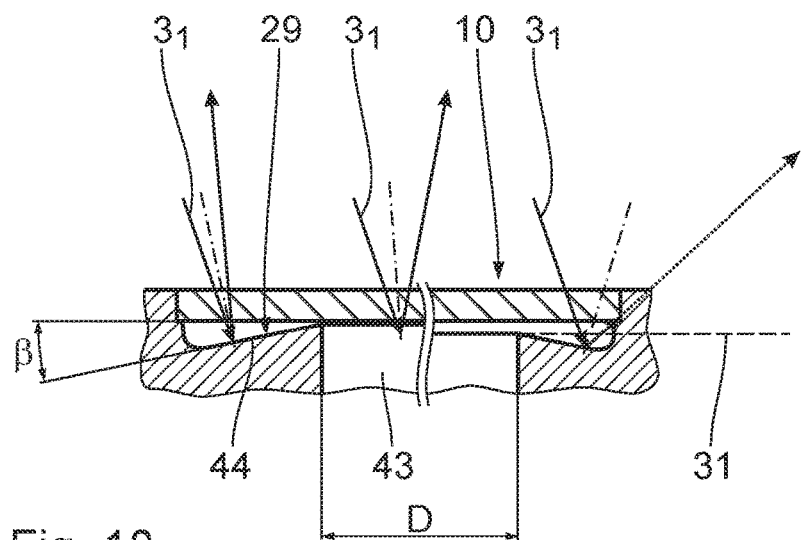
Figure 11:
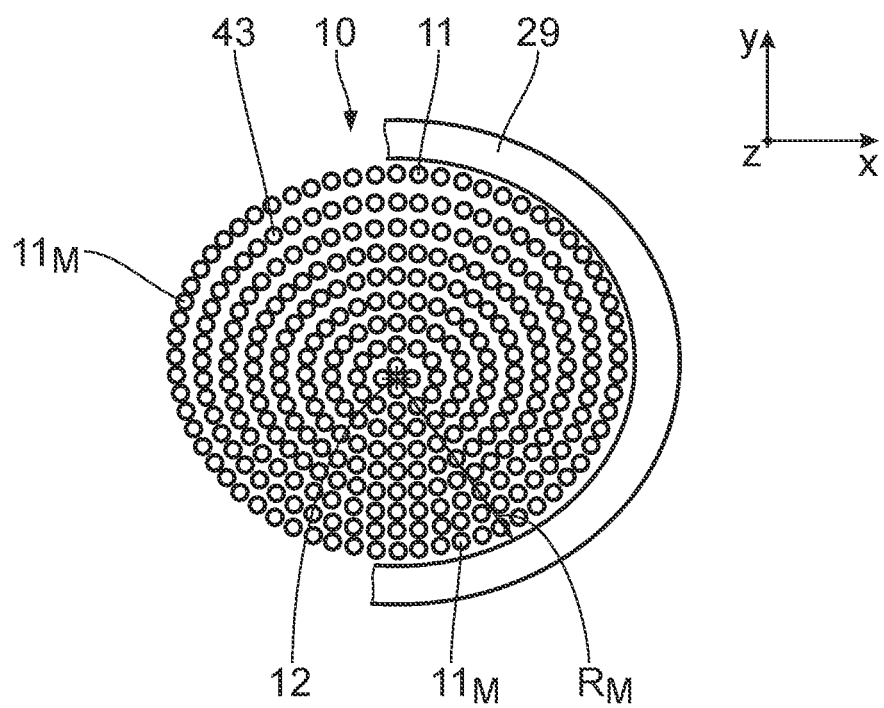

FIG. 4 shows, very schematically and in an exemplary manner, a view of a facet arrangement on a mirror carrier, in a broken-away illustration, of a pupil facet mirror of the illumination optical unit of the projection exposure apparatus according to FIG. 1, wherein, on the edge, only one quadrant of the mirror carrier is depicted and the mirror carrier has a circumferential illumination light trap portion along the edge;

FIG. 5 shows a radial section according to the line V-V through a local trap target region of an embodiment of the illumination light trap portion, wherein the trap target region is embodied as an absorption target location or as an absorption spot;

FIG. 6 shows a section according to the line VI-VI in FIG. 4, embodied as a partial circumferential section, through a further embodiment of an illumination light trap portion with a structured surface, wherein radially extending fluting is provided as a structure example;

FIGS. 7, 8A and 8B show sections according to the lines VII-VII and VIII-VIII in FIG. 4 through two further embodiments of the illumination light trap portion, respectively embodied as a multiple reflection structure;

FIG. 9 shows a further embodiment of a local trap target region in a perspective, schematic and enlarged manner, as seen from a facet arrangement center, for a corresponding embodiment of an illumination light trap portion in the region of an undercut with an illumination light entry opening;

FIG. 10 shows, in a broken away axial section, an embodiment of a pupil facet mirror with a further embodiment of an illumination light trap portion including a reflection surface that is inclined in relation to a carrier plane of the mirror carrier and arranged conically around a facet arrangement center of the pupil facet mirror; and FIG. 11 shows a further embodiment of a facet arrangement of a pupil facet mirror with an illumination light trap portion arranged around the facet arrangement, the illumination light trap portion being shown in a broken away manner in the region of approximately half the circumference around the facet arrangement.

A microlithographic projection exposure apparatus 1 serves for producing a microstructured or nanostructured electronic semiconductor component. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron or a free electron laser (FEL) may also be used for the light source 2. Information concerning such a light source can be found by the person skilled in the art in U.S. Pat. No. 6,859,515 B2, for example. EUV illumination light or illumination radiation in the form of an imaging light beam 3 is used for illumination and imaging within the projection exposure apparatus 1. The imaging light beam 3 downstream of the light source 2 firstly passes through a collector 4, which can be, for example, a nested collector having a multi-shell construction known from the prior art, or alternatively an ellipsoidally shaped collector then arranged downstream of the light source 2. A corresponding collector is known from EP 1 225 481 A. Downstream of the collector 4, the EUV illumination light 3 firstly passes through an intermediate focal plane 5, which can be used for separating the imaging light beam 3 from undesirable radiation or particle portions. After passing through the intermediate focal plane 5, the imaging light beam 3 firstly impinges on a field facet mirror 6. The field facet mirror 6 constitutes a first facet mirror of the projection exposure apparatus 1. The field facet mirror 6 includes a plurality of field facets which are arranged on a first mirror carrier 6a.

In order to facilitate the description of positional relationships, a Cartesian global xyz-coordinate system is in each case depicted in the drawing. In FIG. 1, the x-axis runs perpendicularly to the plane of the drawing and out of the latter. The y-axis runs toward the right in FIG. 1. The z-axis runs upward in FIG. 1.

In order to facilitate the description of positional relationships for individual optical components of the projection exposure apparatus 1, a Cartesian local xyz- or xy-coordinate system is in each case also used in the following figures. The respective local xy-coordinates span, unless described otherwise, a respective principal arrangement plane of the optical component, for example a reflection plane. The x-axes of the global xyz-coordinate system and of the local xyz- or xy-coordinate systems run parallel to one another. The respective y-axes of the local xyz- or xy-coordinate systems are at an angle with respect to the y-axis of the global xyz-coordinate system which corresponds to a tilting angle of the respective optical component about the x-axis.

Figure 2:
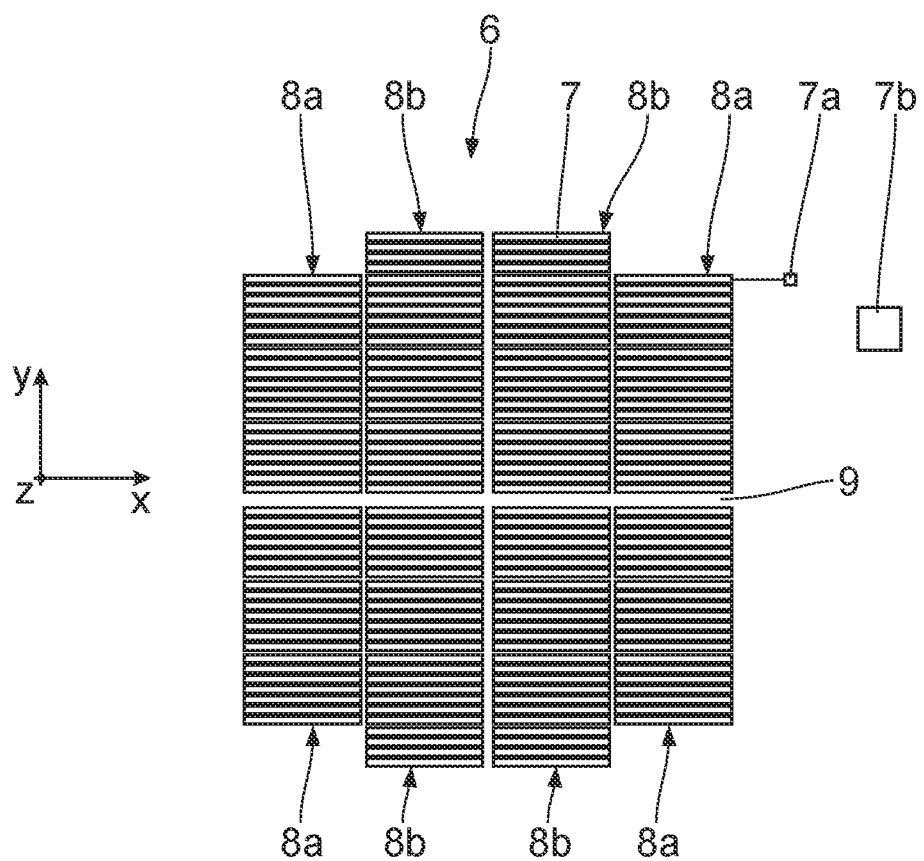
FIG. 2 shows a view of a facet arrangement of a field facet mirror of the illumination optical unit of the projection exposure apparatus according to FIG. 1, in the "rectangular field" embodiment.

FIG. 2 shows, in an exemplary manner, a facet arrangement of field facets 7 of the field facet mirror 6 in the "rectangular field" embodiment. The field facets 7 are rectangular and have in each case the same x/y aspect ratio. The x/y aspect ratio can be for example 12/5, can be 25/4, can be 104/8, can be 20/1 or can be 30/1.

The field facets 7 predetermine a reflection surface of the field facet mirror 6 and are grouped into four columns with 6 to 8 field facet groups 8a, 8b each. The field facet groups 8a respectively have seven field facets 7. The two additional field facet groups 8b, on the edge, of the two central field facet columns respectively have four field facets 7. The facet arrangement of the field facet mirror 6 has interstices 9, in which the field facet mirror 6 is shadowed by holding spokes of the collector 4, between the two central facet columns and between the third facet line and the fourth facet line. To the extent that an LPP source is used as the light source 2, corresponding shadowing may also emerge from a tin droplet generator which is arranged adjacent to the collector 4 and not depicted in the drawing.

Figure 3:
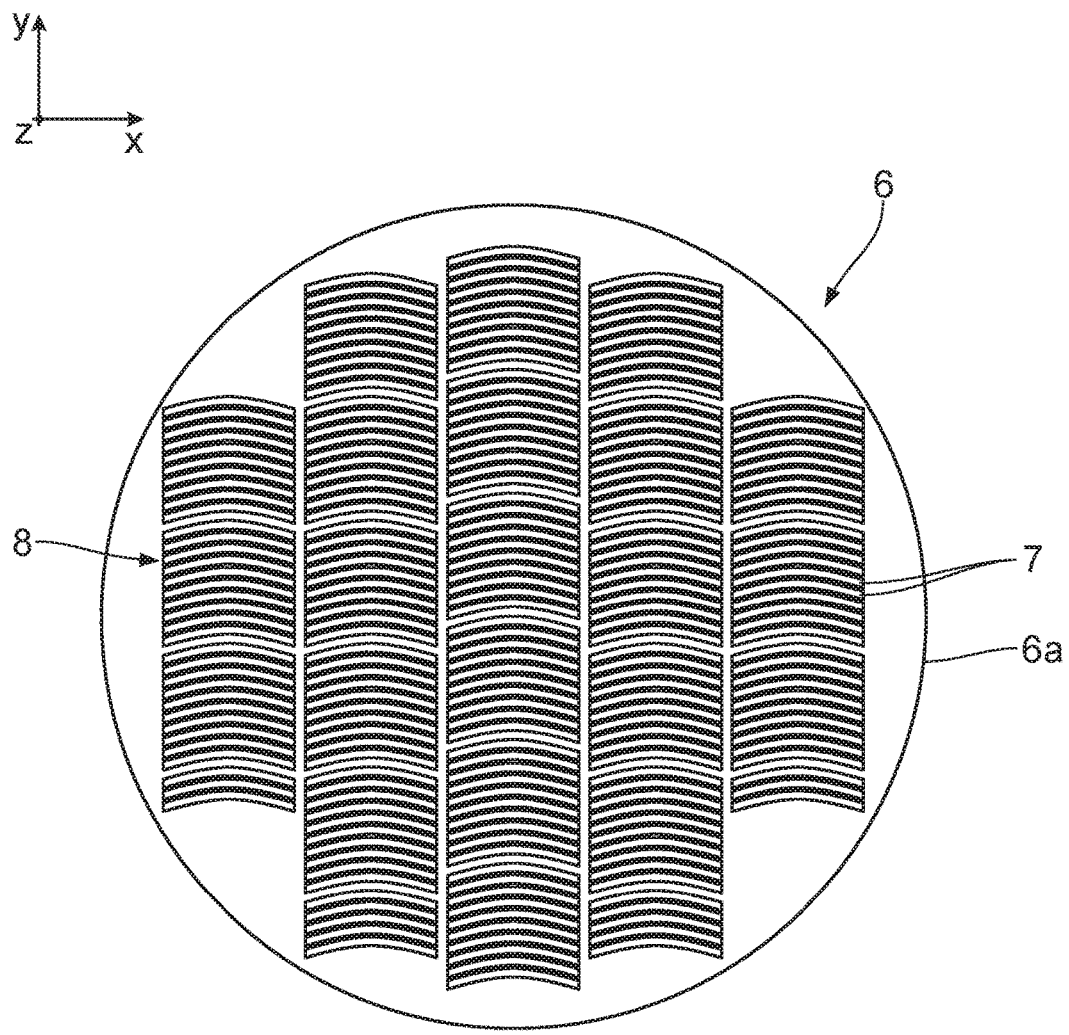
FIG. 3 shows, in an illustration similar to FIG. 2, a facet arrangement of a further embodiment of a field facet mirror in the "arcuate field" embodiment.

FIG. 3 shows a further "arcuate field" embodiment of a field facet mirror 6. Components that correspond to those that were explained above with reference to the field facet mirror 6 according to FIG. 2 have the same reference signs and are only explained to the extent that these differ from the components of the field facet mirror 6 according to FIG. 2.

The field facet mirror 6 according to FIG. 3 includes a field facet arrangement with arcuate field facets 7. These field facets 7 are arranged in a total of five columns with, in each case, a plurality of field facet groups 8. The field facet arrangement is inscribed in a circular boundary of the mirror carrier 6a of the field facet mirror 6.

The field facets 7 in the embodiment according to FIG. 3 all have the same area and the same ratio of width in the x-direction and height in the y-direction, which corresponds to the x/y-aspect ratio of the field facets 7 of the embodiment according to FIG. 2.

The field facets 7 are adjustable or repositionable, in each case between a plurality of different tilt positions, for example repositionable between three tilt positions. Depending on the embodiment of the field facet mirror 6, all or else some of the field facets 7 can also be repositionable between two or between more than three different tilt positions. To this end, each of the field facets is respectively connected to an actuator 7a, which is depicted very schematically in FIG. 2. The actuators 7a of all tiltable field facets 7 can be actuated by way of a central control device 7b, which is likewise depicted schematically in FIG. 2.

After reflection at the field facet mirror 6, the imaging light beam 3 split into imaging light partial beams assigned to the individual field facets 7 impinges on a pupil facet mirror 10. The respective imaging light partial beam of the entire imaging light beam 3 is guided along a respective imaging light channel, which is also referred to as the illumination channel.

FIG. 4 very schematically shows an exemplary facet arrangement of pupil facets 11 of the pupil facet mirror 10. The pupil facet mirror 10 constitutes a second facet mirror of the projection exposure apparatus 1. The pupil facets 11 are arranged on a carrier plate 10a of the pupil facet mirror 10. The pupil facets 11 are arranged around a facet arrangement center 12 on the pupil facet mirror carrier 10a. The pupil facets 11 are arranged around the center 12 in lines and columns in an x/y-grid. The pupil facets 11 have square reflection surfaces. Other forms of reflection surfaces are also possible, for example rectangular, round or polygonal surfaces, for example hexagonal or octagonal surfaces. Pupil facets 11 that are arranged in the form of a rhombus are also possible.

Exactly one pupil facet 11 can be assigned to each imaging light partial beam of the EUV illumination light 3 which is reflected by one of the field facets 7 in one of the e.g. three tilt positions, such that a respective facet pair impinged upon and including exactly one of the field facets 7 and exactly one of the pupil facets 11 predefines the imaging light channel for the associated imaging light partial beam of the EUV illumination light 3. Thus, in all or specific tilt positions of the respective field facet 7, this field facet 7 has assigned to it exactly one pupil facet 11 for deflecting the EUV illumination light 3 in the direction of this pupil facet 11.

The channel-by-channel assignment of the pupil facets 11 to the field facets 7 is effected depending on a desired illumination by the projection exposure apparatus 1. On account of the various possible field facet tilt positions, each of the field facets 7 can therefore predetermine different imaging light channels. The illumination light partial beans are guided superposed on one another into an object field of the projection exposure apparatus 1 via the illumination channels predetermined thus.

Via the pupil facet mirror 10 (FIG. 1) and a downstream transfer optical unit 16 consisting of three EUV mirrors 13, 14, 15, the field facets 7 are imaged into an object plane 17 of the projection exposure apparatus 1. The EUV mirror 15 is embodied as a mirror for grazing incidence (grazing incidence mirror). Arranged in the object plane 17 is an object in the form of a reticle 18, from which, with the EUV illumination light 3, an illumination region is illuminated which coincides with the object field 19 of a downstream projection optical unit 20 of the projection exposure apparatus 1. The illumination region is also referred to as an illumination field. The object field 19 is rectangular or arcuate depending on the concrete embodiment of an illumination optical unit of the projection exposure apparatus 1. The imaging light channels are superimposed in the object field 19. The EUV illumination light 3 is reflected from the reticle 18. The reticle 18 is held by an object holder 21, which is displaceable in a driven manner along the displacement direction y with the aid of an object displacement drive 22 indicated schematically.

It is possible to dispense with the transfer optical unit 16 provided that the pupil facet mirror 10 is arranged directly in an entry pupil of the projection optical unit 20.

The projection optical unit 20 images the object field 19 in the object plane 17 into an image field 23 in an image plane 24. Arranged in the image plane 24 is a wafer 25 bearing a light-sensitive layer, which is exposed during the projection exposure via the projection exposure apparatus 1. The wafer 25, that is to say the substrate onto which imaging is effected, is held by a wafer or substrate holder 26, which is displaceable along the displacement direction y synchronously with the displacement of the object holder 21 with the aid of a wafer displacement drive 27 likewise indicated schematically. During the projection exposure, both the reticle 18 and the wafer 25 are scanned in a synchronized manner in the y-direction. The projection exposure apparatus 1 is embodied as a scanner. The scanning direction y is the object displacement direction.

The field facet mirror 6, the pupil facet mirror 10 and the mirrors 13 to 15 of the transfer optical unit 16 are parts of an illumination optical unit 28 of the projection exposure apparatus 1. Together with the projection optical unit 20, the illumination optical unit 28 forms an illumination system of the projection exposure apparatus 1.

A respective group of pupil facets 11, which are impinged by the illumination light 3 via field facets 7 assigned to appropriate illumination channels, defines a respective illumination setting, i.e. an illumination angle distribution when illuminating the object field 19, which can be predetermined by the projection exposure apparatus 1. By repositioning the tilt positions of the field facets 7, it is possible to change between various such illumination settings. Examples of such illumination settings are described in WO 2014/075902 A1 and WO 2011/154244 A1.

To the extent that these are impinged upon by the illumination light 3, maximum angle pupil facets $11_M$ arranged at the edge of the pupil facet mirror carrier predetermine maximum illumination angles of the illumination light 3 that deviate maximally from a chief ray incidence of the illumination light 3 on the object field 19. The chief ray incidence on the object field 19 is the angle of incidence of a chief ray of the illumination light 3, in particular of the chief ray of a central object field point, on the object field 19. The maximum angle pupil facets $11_M$ predetermine a value of an illumination angle parameter sigma of 1.90% of the energy of the illumination angle distribution set in this way is then available within a circle, the minimum radius of which is predetermined by the whole entry pupil of the projection optical unit 20. The maximum angle pupil facets $11_M$ are those pupil facets 11 with the largest distance from the facet arrangement center 12 at the respective circumferential position. In the case of the regular grid arrangement according to FIG. 4, all pupil facets 11 lie within a circle with an arrangement maximum radius $R_M$. At their respective circumferential position around the arrangement center 12, the maximum angle pupil facets $11_M$ respectively have the smallest distance from the arrangement maximum radius $R_M$.

The pupil facet mirror carrier 10a has, circumferentially along the edge, an illumination light trap portion 29, the distance of which from the facet arrangement center 12 is greater than a distance of the maximum angle pupil facets $11_M$ from the facet arrangement center 12. The illumination light trap portion 29 is embodied over the whole circumference around the facet arrangement center 12 as a part of the pupil facet mirror carrier 10a. The illumination light trap portion 29 surrounds the entire facet arrangement of the pupil facet mirror 10, i.e. lies to the outside thereof when seen in the radial direction from the center 12.

The illumination light trap portion 29 serves for the controlled dissipation of illumination light 3 which is currently not used for illuminating the object field 19. Illumination light components not used in this way can be steered, for example, from the field facets 7 in a dissipation tilt position to the illumination light trap portion 29.

In a first embodiment, the illumination light trap portion 29 has, at least in parts, an absorbing embodiment for the illumination light 3.

For the purposes of a controlled dissipation of a partial beam of the illumination light 3, the field facet 7 belonging to the assigned illumination channel is tilted in such a way that this illumination light partial beam is guided to the absorbing illumination light trap portion 29. Unwanted scattering toward the object field 19 of the illumination light 3 to be dissipated is avoided as a result thereof.

The absorbing effect of the illumination light trap portion 29 can be brought about by an appropriate absorbing coating. Alternatively, or additionally, it is possible to ensure the absorbing effect by way of an appropriate material selection for the illumination light trap portion 29. To this end, the illumination light trap portion 29 can be made of e.g. copper.

In a further, alternatively or additionally possible embodiment of the illumination light trap portion 29, the surface thereof is structured, at least in parts, for producing a scattering effect for the illumination light 3. FIG. 6 shows such a structured embodiment of the surface of the illumination light trap portion 29. A cut line of FIG. 6 extends in the circumferential direction through the illumination light trap portion 29 around the facet arrangement center 12. The structuring of the surface is formed as radially extending fluting. A structure inclination angle $\alpha$ between a structure flunk 30 of this fluting and a carrier plane 31 of the pupil facet mirror carrier 10a lies in the range between 10° and 60° and lies at 52.5° in the depicted exemplary embodiment according to FIG. 6. A structure period S of the fluting structure lies in the range between 0.5 mm and 5 mm.

The embodiment of the illumination light trap portion 29 with fluting leads to targeted scattering of illumination light 3 to be dissipated such that the latter likewise cannot reach the object field 19 in an unwanted manner.

FIG. 7 shows a further embodiment of the illumination light trap portion 29, which can likewise be used as an alternative or in addition to the variants explained above. In the embodiment according to FIG. 7, the illumination light trap portion 29 has a trap entry channel 32 circumferentially around the facet arrangement center 12. Illumination light (cf. the exemplary beam paths $3_1$, $3_2$ and $3_3$ in FIG. 7) which enters through the trap entry channel 32 experiences multiple reflections within a torus-shaped trap body 33 of the illumination light trap portion 29 according to FIG. 7. The trap body 33 can be carried by a likewise circumferential carrying frame 34 of the pupil facet mirror carrier 10a, the carrying frame being depicted by way of a dotted line in FIG. 7 and, in the depicted embodiment, having an approximately rhomboid cross section.

Once again, an inner wall of the trap body 33 can have an embodiment that absorbs the illumination light 3. Once again, this can be effectuated by way of a coating, by way of structuring and/or by way of a material selection.

FIG. 8A shows a further embodiment of a multiple reflection structure which can be used in an appropriate embodiment of the illumination trap portion 29. Components and reference signs which have already been explained above in relation to FIGS. 1 to 7, and in particular in relation to FIG. 7, are denoted by the same reference signs and are not explained again in detail.

A trap body 33 of the illumination light trap portion 29 according to FIG. 8 once again has a circumferential embodiment around the facet arrangement center 12 of the pupil facet mirror 10 equipped therewith. In the sectional illustration according to FIG. 8, which is once again guided in the radial direction, the circumferential trap body 33 has a curved blind groove design. Depending on the embodiment of the trap body 33 according to FIG. 8, a curve of this blind groove design can be embodied toward the facet arrangement center 12 or away from the latter. The blind groove design once again brings about multiple reflections of rays $3_1$, $3_2$ and $3_3$ of the illumination light 3 that enter through the trap entry channel 32.

FIG. 8B shows a further embodiment of the multiple reflection structure which can be used in an appropriate embodiment of the illumination trap portion 29. Components and reference signs which have already been explained above in relation to FIGS. 1 to 7, 8A, and in particular in relation to FIGS. 7 and 8A, are denoted by the same reference signs and are not explained again in detail.

Like in FIGS. 7 and 8A, the cross section of a circumferential trap body is indicated in FIG. 8B, the trap body being embodied as, in the cross section, a substantially V-shaped circumferential groove with two hollow circumferential ribs that widen this V-cross section in the transverse direction. Light that is incident from the top into the illumination light trap portion 29 according to FIG. 8B is reflected multiple times at the V-cross section and/or within the transverse ribs and absorbed and dissipated in the process.

The embodiments of the illumination light trap portion 29 explained above are respectively embodied in such a way that the illumination light-dissipating effect thereof is uniform over the entire circumferential extent of the illumination light trap portion 29. Alternatively, or additionally, the illumination light trap portion 29 can have at least some local trap target regions.

Below, a first embodiment of such a local trap target region 35 is described on the basis of FIGS. 4 and 5. The trap target region 35 has a local absorption target location 36, which is also referred to as absorption spot. An absorption body 37 is let into the illumination light trap portion 29 at the absorption target location 36. It is made of a material that absorbs the illumination light 3. The absorption body 37 has thermal contact with a heat sink 38 of the pupil facet mirror carrier 10a. The latter can be locally assigned to one of the absorption bodies 37 in each case or be present in an overall circumferential manner around the facet arrangement center 12.

The illumination light trap portion 29 can have a plurality of such trap target regions 35, for example eight, ten, twenty, twenty-five, thirty, forty or fifty of such trap target regions 35. An even larger number of such trap target regions 35 is also possible. A smaller number of such trap target regions, for example four or six trap target regions, is also possible.

The heat sink 38 can provide passive and/or active cooling of the absorption body 37. In the case of active cooling, this may relate to fluid cooling, i.e. cooling on the basis of a gas and/or a liquid as a heat carrier medium. In the passive cooling variant, the heat sink 38 can be thermally coupled to surroundings of the pupil facet mirror carrier 10a via regions with an enlarged surface, for example via cooling ribs.

FIG. 9 shows a further possible design of a trap target region 39 in a perspective, schematic view which is from a viewing direction substantially around the facet arrangement center 12. FIG. 4 shows a likewise schematic plan view of the trap target region 39.

The trap target region 39 includes a trap entry opening 40 which is embodied in the region of an undercut 41 of the illumination light trap portion 29. A trap light path of an illumination light beam $3_1$ in the trap target region 39 is depicted by dots in FIG. 9. The illumination light beam $3_1$ enters through the trap entry opening 40 into the illumination light trap portion 29, and initially experiences a reflection at a groove base section 42, which surrounds the facet arrangement center 12, of the illumination light trap portion 29, and the illumination light beam is then absorbed at an undercut 41 of the trap target region 39.

FIG. 10 shows a further embodiment of an illumination light trap portion 29. Components corresponding to those which were already explained above with respect to FIGS. 1 to 9 have the same reference signs and are not once again explained in detail.

FIG. 10 shows the pupil facet mirror 10 in an illustration that is broken down both outside of, and within, the region of an inner facet arrangement 43. The facet arrangement 43 of the pupil facet mirror 10 according to FIG. 10 has a diameter D which, in fact, is substantially larger than depicted in FIG. 10.

In the embodiment according to FIG. 10, the illumination light trap portion 29 is embodied as a reflection surface 44 that is inclined in relation to the carrier plane 31 of the pupil facet mirror carrier 10a. An inclination angle β of the inclined reflection surface 44 in relation to the carrier plane 31 lies in the region of 30°. Other inclination angles in the range between 5° and 60° are also possible.

The reflection surface 44 of the illumination light trap portion 29 is arranged conically around the facet arrangement center 12.

FIG. 10 shows beam paths of various illumination light individual rays which, respectively proceeding from a specific field facet 7, are steered toward the pupil facet mirror 10. The individual ray $3_1$ is used to illuminate the object field 19 and is reflected from a specific pupil facet 11 of the pupil facet arrangement 43 toward the object field 19. The illumination light individual ray $3_2$ is reflected by the inclined reflection surface 44 of the illumination light trap portion 29 in such a way that it does not reach the object field 19 but, instead, is absorbed, for example by way of an absorption body arranged in the beam path of the individual ray $3_2$. A corresponding statement applies to the further illumination light individual ray $3_3$, which is likewise not used for illuminating the object field 19 but, instead, is dissipated in a controlled manner by reflection at the inclined reflection surface 44.

FIG. 11 shows a further embodiment of a facet arrangement 43 of the pupil facet mirror 10. There, the facet arrangement center 12 does not constitute the geometric center of the facet arrangement 43. When assessing whether an illumination light trap portion 29 in the embodiment of the pupil facet mirror 10 according to FIG. 11 has a distance from the facet arrangement center 12 that is greater than a distance of a maximum angle pupil facet $11_M$ from the facet arrangement center 12, use is made of the distance of the illumination light trap portion 29 along the radius $R_M$ of the respective maximum angle pupil facet $11_M$. This distance along the radius $R_M$ is not constant over the entire circumference of the illumination light trap portion 29, unlike the approximately constant embodiment according to FIG. 4.

Below, two further embodiments of illumination light trap portions 45, 46 are explained on the basis of FIG. 4, the further embodiments being able to be used as an alternative or in addition to the embodiments, described above, of the illumination light trap portion 29 for controlled dissipation of the illumination light 3. In these further illumination light trap portions 45, 46, their distance from the facet arrangement center 12 is at most as large as a distance of a maximum angle pupil facet $11_M$ from the facet arrangement center 12.

The illumination light trap portion 45 is embodied as a group of special pupil facets $11_S$ which, at the same time, may be maximum angle facets $11_M$. For dissipating thermal energy, these special facets $11_S$ are thermally coupled to a trap heat sink. This can be carried out just as described above in conjunction with the trap target region 35 according to FIGS. 4 and 5. The special facet $11_S$, which is thermally coupled to the trap heat sink 38, then takes the place of the absorption body 37. Possible arrangement examples for the special facets $11_S$ are indicated in FIG. 4 by pupil facets 11 that have been marked with a cross. Other arrangements for the special facets $11_S$ are also possible, for example in interstices within the pupil that have not been occupied by illumination facets, for example directly adjacent to the pupil facets 11 that have been marked by a cross in FIG. 4 or in the region of the facet arrangement center 12.

The illumination light trap portion 46 is embodied as a constituent of the facet arrangement 43 as a specific trap region. This specific trap region 46 can assume the area of a plurality of pupil facets 11 and, for example, a plurality of maximum angle pupil facets $11_M$. The trap special region 46 is once again coupled thermally to a trap heat sink in the style of the heat sink 38 according to FIG. 5 for the purposes of dissipating thermal energy. Possible arrangements of trap special regions 46 are indicated in FIG. 4 by dashed circumferential lines.

For the purposes of controlled light dissipation by the illumination light trap portions 45, 46, field facets 7 are once again tilted in a controlled manner in such a way that the illumination light 3 to be dissipated impinges via these field facets 7 on the illumination light trap portions 45, 46 and is absorbed there.

It is also possible to dissipate unwanted longer wavelength light components in a controlled manner with the aid of the illumination light trap portions explained above.

During the projection exposure, firstly the reticle 18 and the wafer 25, which bears a coating that is light-sensitive to the illumination light 3, are provided. By comparing the actual set illumination parameters with intended values, a decision is made as to whether parts of the illumination light 3 should be dissipated by the respective embodiment of an illumination light trap portion 29, 45 and/or 46. As soon as such a controlled dissipation of the illumination light 3 should take place, the field facets 7 selected to this end are tilted in such a way that the illumination light 3 guided thereover is steered toward the illumination light trap portions 29, 45 and/or 46. Subsequently, a portion of the reticle 18 is projected onto the wafer 25 with the aid of the projection exposure apparatus 1. Finally, the light-sensitive layer on the wafer 25 that has been exposed with the illumination light 3 is developed. A microstructured or nanostructured component, for example a semiconductor chip, is produced in this way.

What is claimed is:

1. An illumination optical unit configured to illuminate an object field with illumination light, the illumination optical unit comprising:

a first facet mirror in a beam path of the illumination light, the first facet mirror comprising a plurality of first facets supported by a first mirror carrier, at least some of the first facets being adjustable between a plurality of tilt positions; and a second facet mirror downstream of the first facet mirror in the beam path of the illumination light, the second facet mirror comprising a plurality of second facets supported by a second mirror carrier around a facet arrangement center, wherein:
the illumination optical unit is configured so that, during use of the illumination optical unit, partial beams of the illumination light are guided superposed on one another into the object field, respectively via illumination channels;
one of the first facets and one of the second facets belongs to each of the illumination channels;
the plurality of second facets comprises maximum angle facets arranged at an edge of the second mirror carrier;
the maximum angle facets predetermine maximum illumination angles of the illumination light which deviate maximally from a chief ray incidence on the object field;
the second mirror carrier comprises an illumination light trap portion;
the illumination light trap portion is a first distance from the facet arrangement center;
the maximum angle facets are a second distance from the facet arrangement center;
the first distance is greater than the second distance;
the illumination light trap portion comprises a reflection surface that is inclined in relation to a carrier plane of the second mirror carrier; and
the reflection surface of the illumination light trap portion is arranged conically around the facet arrangement center.

2. The illumination optical unit of claim 1, wherein the illumination light trap portion comprises, at least in parts, a member configured to absorb the illumination light.

3. The illumination optical unit of claim 1, wherein a surface of the illumination light trap portion is structured, at least in parts, to produce a scattering effect for the illumination light.

4. The illumination optical unit of claim 1, wherein the illumination light trap portion comprises, at least in part, a multiple reflection structure.

5. The illumination optical unit of claim 1, wherein the illumination light trap portion comprises at least some local trap target regions.

6. The illumination optical unit of claim 1, wherein an inclination angle of the inclined reflection surface in relation to the carrier plane of the second mirror carrier lies in the range between 5° and 60°.

7. The illumination optical unit of claim 6, wherein the illumination light trap portion comprises, at least in parts, a member configured to absorb the illumination light.

8. The illumination optical unit of claim 6, wherein a surface of the illumination light trap portion is structured, at least in parts, to produce a scattering effect for the illumination light.

9. The illumination optical unit of claim 6, wherein the illumination light trap portion comprises, at least in part, a multiple reflection structure.

10. The illumination optical unit of claim 1, wherein an inclination angle of the inclined reflection surface in relation to the carrier plane of the second mirror carrier lies in a range selected from the group consisting of between 5° and 15°, between 15° and 30°, between 30° and 45°, and between 45° and 60°.

11. The illumination optical unit of claim 1, wherein the second facet mirror comprises an illumination light trap portion.

12. An optical system, comprising:
an illumination optical unit according to claim 1; and
a projection optical unit configured to image the object field into an image field.

13. An optical system, comprising:
an illumination optical unit according to claim 1; and
a light source configured to produce the illumination light.

14. An apparatus, comprising:
an illumination optical unit according to claim 1;
a projection optical unit configured to image the object field into an image field; and
a light source configured to produce the illumination light,
wherein the apparatus is a projection exposure apparatus.

15. A method of using a projection exposure apparatus comprising an illumination optical unit and a projection optical unit, the method comprising:
using the illumination optical unit to illuminate a reticle comprising a structure; and
using the projection optical unit to project the illuminated structure onto a light-sensitive material,
wherein the illumination optical unit is an illumination optical unit according to claim 1.

16. An illumination optical unit configured to illuminate an object field with illumination light, the illumination optical unit comprising:
a first facet mirror that is in a beam path of the illumination light, the first facet mirror comprising a plurality of first facets supported by a first mirror carrier, at least some of the first facets being adjustable between a plurality of tilt positions;
a second facet mirror downstream of the first facet mirror in the beam path of the illumination light, the second facet mirror comprising a plurality of second facets supported by a second mirror carrier around a facet arrangement center; and
a trap heat sink,
wherein:
the illumination optical unit is configured so that, during use of the illumination optical unit, partial beams of the illumination light are guided superposed on one another into the object field, respectively via illumination channels;
one of the first facets and one of the second facets belongs to each of the illumination channels;
the plurality of second facets comprises maximum angle facets arranged at an edge of the second mirror carrier;
the maximum angle facets are configured to predetermine maximum illumination angles of the illumination light which deviate maximally from a chief ray incidence on the object field;
the second mirror carrier comprises an illumination light trap portion;
the illumination light trap portion is a first distance from the facet arrangement center;
the maximum angle facets are a second distance from the facet arrangement center;
the first distance is at most as long as the second distance; and
the illumination light trap portion is coupled thermally to the trap heat sink to dissipate thermal energy away from the illumination light trap portion.

17. An optical system, comprising:
an illumination optical unit according to claim 16; and
a projection optical unit configured to image the object field into an image field.

18. An optical system, comprising:
an illumination optical unit according to claim 16; and
a light source configured to produce the illumination light.

19. An apparatus, comprising:
an illumination optical unit according to claim 16;
a projection optical unit configured to image the object field into an image field; and
a light source configured to produce the illumination light,
wherein the apparatus is a projection exposure apparatus.

20. A method of using a projection exposure apparatus comprising an illumination optical unit and a projection optical unit, the method comprising:
using the illumination optical unit to illuminate a reticle comprising a structure; and
using the projection optical unit to project the illuminated structure onto a light-sensitive material,
wherein the illumination optical unit is an illumination optical unit according to claim 16.

21. The illumination optical unit of claim 16, wherein:
the illumination optical unit comprises a plurality of trap heat sinks;
the illumination light trap portion comprises a plurality of absorption bodies configured to absorb the illumination light; and
each absorption body is coupled thermally to a corresponding trap heat sink to dissipate thermal energy away from the illumination light trap portion.

22. The illumination optical unit of claim 21, wherein the absorption bodies are arranged circumferentially around the facet arrangement center.

23. The illumination optical unit of claim 21, wherein, for at least some of the absorption bodies, the absorption body is one of the second facets.

\* \* \* \* \*